(12) United States Patent
Nomura et al.

(10) Patent No.: US 11,270,922 B2
(45) Date of Patent: Mar. 8, 2022

(54) RADIO-FREQUENCY MODULE

(71) Applicant: Murata Manufacturing Co., Ltd., Kyoto (JP)

(72) Inventors: Tadashi Nomura, Kyoto (JP); Takafumi Kusuyama, Kyoto (JP); Yoshitaka Echikawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/004,454

(22) Filed: Aug. 27, 2020

(65) Prior Publication Data
US 2020/0395262 A1   Dec. 17, 2020

Related U.S. Application Data

(63) Continuation of application No. PCT/JP2019/010730, filed on Mar. 15, 2019.

(30) Foreign Application Priority Data

Mar. 20, 2018  (JP) .............................. JP2018-052323

(51) Int. Cl.
*H01L 23/31* (2006.01)
*H01L 21/56* (2006.01)
(Continued)

(52) U.S. Cl.
CPC .......... *H01L 23/3185* (2013.01); *H01L 21/56* (2013.01); *H01L 23/49811* (2013.01);
(Continued)

(58) Field of Classification Search
None
See application file for complete search history.

(56) References Cited

U.S. PATENT DOCUMENTS

2006/0063312 A1   3/2006   Kurita
2013/0155639 A1   6/2013   Ogawa et al.
(Continued)

FOREIGN PATENT DOCUMENTS

JP   2005-203633 A   7/2005
JP   2006-19433 A    1/2006
(Continued)

OTHER PUBLICATIONS

International Search Report for PCT/JP2019/010730 dated May 14, 2019.
Written Opinion for PCT/JP2019/010730 dated May 14, 2019.

*Primary Examiner* — Long Pham
(74) *Attorney, Agent, or Firm* — Pearne & Gordon LLP

(57) ABSTRACT

A radio-frequency module 1a includes a wiring board 2, a first component 3a mounted on a lower surface 2a of the wiring board 2, a plurality of connection terminals 4, a first sealing resin layer 5 that covers the first component 3a and the connection terminals 4, a plurality of second components 3b mounted on an upper surface 2b of the wiring board 2, a second sealing resin layer 6 that covers the second components 3b, and a shield film 7. By adjusting surface roughness of a lower surface 5a of the first sealing resin layer 5, surface roughness of a lower surface 30a of the first component 3a, and surface roughness of a lower surface 4a of the connection terminal 4, it is possible to prevent abnormal deposition of plating and a crack in the first component 3a, and to prevent malfunction of the radio-frequency module 1a.

13 Claims, 7 Drawing Sheets

(51) Int. Cl.
*H01L 23/498* (2006.01)
*H01L 23/552* (2006.01)
*H01L 25/065* (2006.01)
*H01L 25/16* (2006.01)

(52) U.S. Cl.
CPC ........ *H01L 23/552* (2013.01); *H01L 25/0652* (2013.01); *H01L 25/165* (2013.01); *H01L 21/561* (2013.01)

(56) References Cited

U.S. PATENT DOCUMENTS

2014/0185256 A1    7/2014  Ogawa et al.
2020/0395262 A1*  12/2020  Nomura ................. H01L 21/56

FOREIGN PATENT DOCUMENTS

| WO | 2012/023332 A1 | 2/2012 |
| WO | 2013/035715 A1 | 3/2013 |
| WO | 2014/017159 A1 | 1/2014 |
| WO | 2014/017160 A1 | 1/2014 |

* cited by examiner

FIG. 3A

| | SURFACE ROUGHNESS Ra [um] | | | |
|---|---|---|---|---|
| | 0.005 | 0.03 | 0.05 | 0.1 |
| DETERMINATION OF CRACK ABNORMALITY | O | O | O | O |

RELATIONSHIP BETWEEN SURFACE ROUGHNESS Ra OF
COMPONENT AND PRESENCE OR ABSENCE OF CRACK (N=500pcs)

FIG. 3B

| | THICKNESS OF FIRST COMPONENT [um] | | | | |
|---|---|---|---|---|---|
| | 5 | 10 | 20 | 40 | 100 |
| DETERMINATION OF CRACK ABNORMALITY | O | O | O | O | O |

RELATIONSHIP BETWEEN THICKNESS OF COMPONENT AND
PRESENCE OR ABSENCE OF CRACK (N=500pcs)

CUT LINE                    CUT LINE

RADIO-FREQUENCY MODULE

This is a continuation of International Application No. PCT/JP2019/010730 filed on Mar. 15, 2019 which claims priority from Japanese Patent Application No. 2018-052323 filed on Mar. 20, 2018. The contents of these applications are incorporated herein by reference in their entireties.

BACKGROUND OF THE DISCLOSURE

Field of the Disclosure

The present disclosure relates to a radio-frequency module in which a component is mounted on one main surface of a wiring board and the component is covered with a sealing resin layer.

Description of the Related Art

Conventionally, a radio-frequency module such as a module 100 illustrated in FIG. 9 is proposed. In the module 100, a plurality of components 102 sealed with a first sealing resin layer 103 is mounted on an upper surface 101a of a wiring board 101, and a semiconductor component 104 and connection terminals 105 sealed with a second sealing resin layer 106 are mounted on a lower surface 101b of the wiring board 101. In such a module 100, in a case where the semiconductor component 104 having a high heat generating property is mounted, the heat generated from the semiconductor component 104 may cause a defect in the module 100. Therefore, it is necessary to dissipate the heat generated from the semiconductor component 104 to the outside of the module.

Therefore, in the module 100, in order to improve heat dissipation, a surface 104a of the semiconductor component 104 having high heat conductivity is exposed from the second sealing resin layer 106 so as to realize a radio-frequency module having high heat dissipation.

Patent Document 1: WO 2014/017159 A (see paragraphs 0033 to 0048, FIG. 4, and the like)

BRIEF SUMMARY OF THE DISCLOSURE

However, in the structure described in Patent Document 1, in the case of plating the connection terminal 105, plating may be abnormally deposited even on an exposed surface of the resin layer 106 located between the semiconductor component 104 and the connection terminal 105. The exposed surface of the resin layer has a role of insulating the periphery of the connection terminal; however, if plating is deposited on this surface, a short circuit between the connection terminals may occur, which causes malfunction of the module.

The present disclosure has been made in view of the above-described problem, and an object of the present disclosure is to provide a radio-frequency module in which abnormal deposition of plating is suppressed while ensuring heat dissipation, by adjusting the surface roughness of a sealing resin layer, the surface roughness of a connection terminal, and the surface roughness of a component.

In order to achieve the above object, a radio-frequency module of the present disclosure includes a wiring board, a first component which is mounted on one main surface of the wiring board, a first sealing resin layer having a contact surface which is in contact with the one main surface of the wiring board, a facing surface which faces the contact surface, and side surfaces each of which connects an edge of the contact surface and an edge of the facing surface to each other, the first sealing resin layer sealing the first component, and a connection terminal which is embedded in the first sealing resin layer. An opposite surface on a side opposite to a mounting surface of the first component is exposed from the facing surface of the first sealing resin layer. One end of the connection terminal is connected to the one main surface of the wiring board, and another end of the connection terminal is exposed from the facing surface of the first sealing resin layer. Surface roughness of the opposite surface of the first component is smaller than surface roughness of the other end of the connection terminal. Surface roughness of the facing surface of the first sealing resin layer is smaller than surface roughness of the opposite surface of the first component.

According to this configuration, by making each of the surface roughness of the facing surface of the sealing resin layer and the surface roughness of the opposite surface of the first component smaller than the surface roughness of the other end of the connection terminal, nuclei that cause abnormal deposition of plating are less likely to remain and to suppress abnormal deposition of plating when plating is implemented on the other end of the connection terminal. Furthermore, by making the surface roughness of the facing surface of the sealing resin layer smaller than the surface roughness of the opposite surface of the first component, it is possible to prevent short circuit failure between the connection terminals.

Furthermore, a thickness of the first component in the direction perpendicular to the one main surface of the wiring board may be not less than 5 µm and not greater than 100 µm, and the surface roughness of the opposite surface of the first component may be not less than 0.005 µm and not greater than 0.1 µm.

According to this configuration, the height of the radio-frequency module can be reduced by polishing the first component such that the thickness thereof is not greater than 100 µm. Furthermore, by setting the surface roughness of the opposite surface of the first component to be not greater than 0.1 µm, it is possible to prevent occurrence of a crack starting point on the opposite surface of the first component and to prevent damage to the first component.

A plurality of the first components and a plurality of the connection terminals may be mounted on the one main surface of the wiring board, and at least one of the plurality of connection terminals may be arranged between the first components adjacent to each other.

According to this configuration, since more components can be mounted on the radio-frequency module, it is possible to enhance functionality of the radio-frequency module.

The radio-frequency module may further include a second component which is mounted on another main surface of the wiring board, and a second sealing resin layer having a contact surface which is in contact with the other main surface of the wiring board, a facing surface which faces the contact surface, and side surfaces each of which connects an edge of the contact surface and an edge of the facing surface to each other, the second sealing resin layer sealing the second component.

According to this configuration, since the components are mounted on both sides of the wiring board, it is possible to further enhance the functionality of the radio-frequency module.

The radio-frequency module may further include a shield film which covers at least the side surfaces of the first sealing resin layer and the side surfaces and the facing surface of the second sealing resin layer. According to this configuration, it is possible to suppress noise due to electromagnetic waves from the outside and prevent performance degradation of the radio-frequency module.

Furthermore, the connection terminal may be a bump.

According to the present disclosure, the surface roughness of the opposite surface of the first component is made smaller than the surface roughness of the other end of the connection terminal, and the surface roughness of the facing surface of the first sealing resin layer is made smaller than the surface roughness of the opposite surface of the first component. Therefore, it is possible to suppress abnormal deposition of plating while ensuring heat dissipation.

BRIEF DESCRIPTION OF THE SEVERAL VIEWS OF THE DRAWINGS

FIGS. 3A and 3B are tables illustrating the relationship between the surface roughness and presence or absence of cracks and the relationship between the thickness of the first component and the presence or absence of cracks, respectively.

DETAILED DESCRIPTION OF THE DISCLOSURE

First Embodiment

A radio-frequency module 1a according to a first embodiment of the present disclosure will be described with reference to FIGS. 1 and 2. Note that FIG. 1 is a sectional view of the radio-frequency module 1a, and FIG. 2 is a plan view illustrating a lower surface 5a of a first sealing resin layer 5 of the radio-frequency module 1a.

Figure 1:
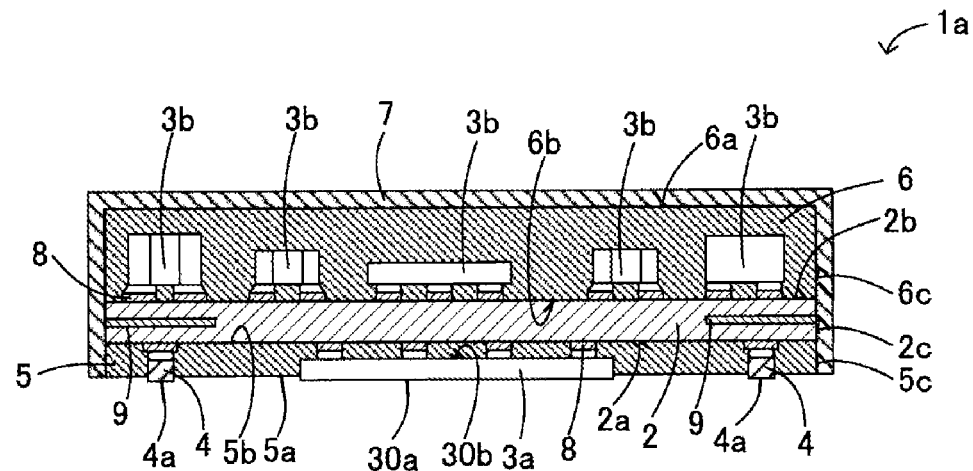
FIG. 1 is a sectional view of a radio-frequency module according to a first embodiment of the present disclosure.
Figure 2:
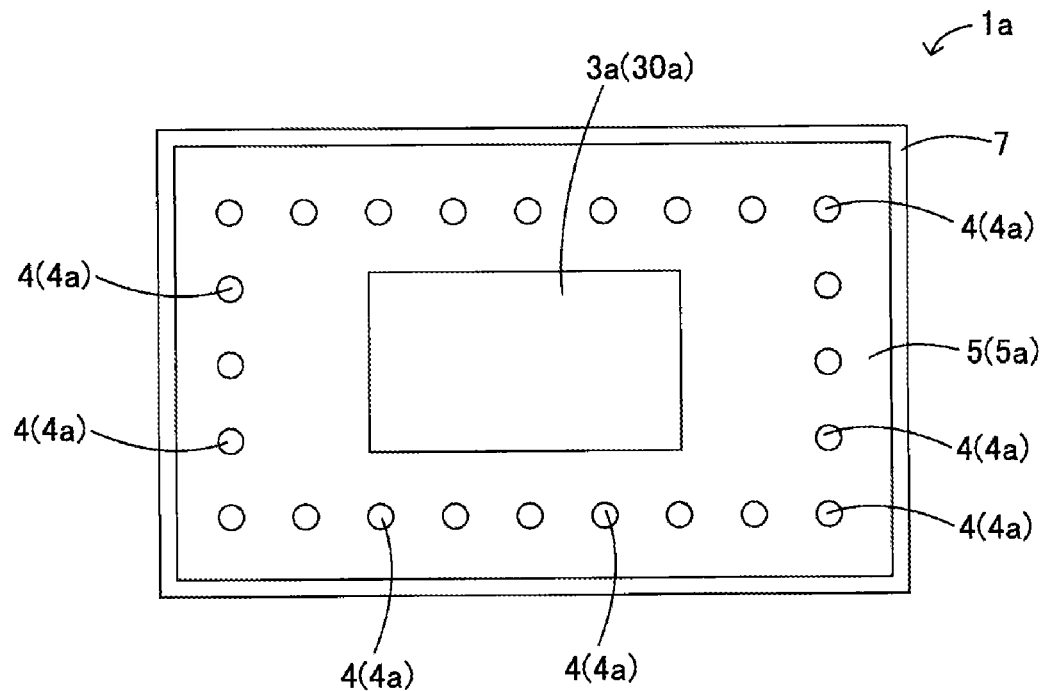
FIG. 2 is a plan view of the radio-frequency module illustrated in FIG. 1.

As illustrated in FIGS. 1 and 2, the radio-frequency module 1a according to this embodiment includes a wiring board 2, a first component 3a and a plurality of connection terminals 4 mounted on a lower surface 2a of the wiring board 2, a first sealing resin layer 5 sealing the first component 3a and the connection terminals 4, a plurality of second components 3b mounted on an upper surface 2b of the wiring board 2, a second sealing resin layer 6 sealing the second components 3b, and a shield film 7 covering side surfaces 5c of the first sealing resin layer 5 and side surfaces 6c and an upper surface 6a of the second sealing resin layer 6, and side surfaces 2c of the wiring board 2. The radio-frequency module 1a is mounted on, for example, a mother board or the like of an electronic device in which a high-frequency signal is used.

The wiring board 2 is formed by laminating a plurality of insulating layers formed of, for example, a low temperature co-fired ceramic, a high temperature co-fired ceramic, glass epoxy resin, or the like.

On the upper surface 2b (corresponding to "the other main surface" of the present disclosure) and the lower surface 2a (corresponding to "one main surface" of the present disclosure) of the wiring board 2, mounting electrodes 8 for mounting the first component 3a, the second components 3b, or the connection terminals 4 are formed. The plurality of connection terminals 4 for external connection are mounted on the lower surface 2a. Various internal wiring electrodes (not illustrated) and ground electrodes 9 are formed between the respective adjacent insulating layers. Furthermore, a plurality of via conductors (not illustrated) for connecting the internal wiring electrodes are formed inside the wiring board 2. Note that each of the mounting electrodes 8 and the internal wiring electrodes are formed of a metal such as Cu, Ag, or Al that is generally used for a wiring electrode. Each via conductor is formed of a metal such as Ag or Cu.

Note that nickel plating and gold plating is applied on each of the mounting electrodes.

The first component 3a is configured of a semiconductor element such as an IC or PA (power amplifier), and is mounted on the wiring board 2 by using a general surface mounting technique such as joining with solder. In order to reduce the height of the radio-frequency module 1a, a lower surface 30a of the first component 3a is polished so that the thickness in the direction perpendicular to the lower surface 2a of the wiring board 2 is not less than 5 µm and not greater than 100 µm. Note that the first component 3a is polished after the first component 3a is mounted on the lower surface 2a of the wiring board 2.

The second component 3b is configured of a chip component such as a chip inductor, a chip capacitor, or a chip resistor. The second component 3b may also be a semiconductor device such as an IC.

The connection terminals 4 are used for input/output with an external board and are arranged along the outer periphery of the radio-frequency module 1a as illustrated in FIG. 2. In this embodiment, the connection terminals 4 are arranged in one row along the outer periphery of the radio-frequency module 1a; however, may be arranged in a plurality of rows depending on the location. The connection terminal 4 may be, for example, obtained by mounting a metal pin on the mounting electrode 8 to be joined with solder, or the connection terminal 4 may be a post electrode formed on the mounting electrode 8 by plating in advance. Alternatively, the connection terminal 4 may be a via formed by forming a hole in a first sealing resin so that the mounting electrode is exposed and then filling the hole with conductive material. Alternatively, the connection terminal 4 may be a solder bump or an Au bump, as in a third embodiment described in detail later. Note that a metal film is formed by plating on the lower surface 4a of the connection terminal 4.

The first sealing resin layer 5 and the second sealing resin layer 6 are formed of a resin generally adopted as a sealing resin such as an epoxy resin containing a silica filler, and seal the first component 3a and the second components 3b, respectively. The first sealing resin layer 5 has an upper surface 5b (corresponding to the "contact surface of the sealing resin layer" of the present disclosure) that is in contact with the lower surface 2a of the wiring board 2, the lower surface 5a (corresponding to the "facing surface of the sealing resin layer" of the present disclosure) that faces the upper surface 5b, and side surfaces 5c. Similarly, the second sealing resin layer 6 has a lower surface 6b that is in contact with the upper surface 2b of the wiring board 2, an upper surface 6a that faces the lower surface 6b, and side surfaces 6c. Further, in order to increase heat conductivity, a filler having high heat conductivity such as an alumina filler may be used.

The shield film 7 covers the side surfaces 5c of the first sealing resin layer 5, the side surfaces 6c and the upper surface 6a of the second sealing resin layer 6, and the side surfaces 2c of the wiring board 2. Further, the shield film 7 is connected to the ground electrodes 9 exposed to the side surfaces 2c of the wiring board 2.

The shield film 7 can be formed in a multi-layer structure including a close-contact film laminated on the side surfaces 5c of the first sealing resin layer 5, the side surfaces 2c of the wiring board 2, the side surfaces 6c and the upper surface 6a of the second sealing resin layer 6, a conductive film laminated on the close-contact film, and a rust preventive film laminated on the conductive film. Here, the close-contact film is provided to enhance the adhesive strength between the conductive film and each of the sealing resin layers 5 and 6, and can be formed of material such as Ti, Cr, or SUS in which passivation occurs. Further, the conductive film is a layer that substantially performs a substantial shield function of the shield film 7, and can be formed of, for example, any of Cu, Ag, and Al. The rust preventive film is provided to prevent the conductive film from being corroded or scratched, and can be formed of, for example, SUS.

Here, the magnitude relationship of surface roughness of the lower surface 30a of the first component 3a, surface roughness of the lower surface 4a of the connection terminal 4, and surface roughness of the lower surface 5a of the first sealing resin layer 5 will be described. A metal film is formed by plating on the lower surface 4a of the connection terminal 4. At this time, if the surface roughness of the lower surface 30a of the first component 3a and the surface roughness of the lower surface 5a of the first sealing resin layer 5 are great, polishing waste or a plating catalyst remains on the lower surface 30a of the first component 3a or the lower surface 5a of the first sealing resin layer 5, and therefore, plating may be abnormally deposited with the polishing waste or the plating catalyst as a nucleus. In particular, if plating is abnormally deposited on the lower surface 5a of the first sealing resin layer 5, a short circuit between the connection terminals 4 occurs. Therefore, the surface roughness of the lower surface 5a of the first sealing resin layer 5 is smaller than each of the surface roughness of the lower surface 4a of the connection terminal 4 and the surface roughness of the lower surface 30a of the first component 3a. Further, since the first component 3a is farther from the connection terminal 4 than the first sealing resin layer 5 is, the influence of abnormal plating deposition is smaller than that in the first sealing resin layer 5. However, if the surface roughness of the lower surface 30a of the first component 3a is great, a crack may be caused and the first component 3a may be damaged. Therefore, the surface roughness of the lower surface 30a of the first component 3a is equal to or greater than the surface roughness of the lower surface 5a of the first sealing resin layer 5 and is smaller than the surface roughness of the lower surface 4a of the connection terminal 4.

That is, since a metal film needs to be formed by plating on the lower surface 4a of the connection terminal 4, the surface roughness of the lower surface 4a of the connection terminal 4 is greater than each of the surface roughness of the lower surface 30a of the first component 3a and the surface roughness of the lower surface 5a of the first sealing resin layer 5. In contrast, since it is necessary to suppress abnormal deposition of plating on the lower surface 5a of the first sealing resin layer 5, the surface roughness of the lower surface 5a of the first sealing resin layer 5 is smaller than each of the surface roughness of the lower surface 30a of the first component 3a and the surface roughness of the lower surface 4a of the connection terminal 4. As a result, in consideration of the influence of abnormal deposition of plating and the possibility that a crack will be generated, the surface roughness of the lower surface 30a of the first component 3a may be smaller than the surface roughness of the lower surface 4a of the connection terminal 4, but may be equal to or greater than the surface roughness of the lower surface 5a of the first sealing resin layer 5.

Further, since it is desired that the thickness of the entire module is thin, it is preferable that the thickness of the first component 3a is not less than 5 µm and not greater than 100 µm or less in consideration of manufacturing limitations. At this time, for example, as described in Patent Document 1, the surface roughness of the surface 104a of the semiconductor component 104 is set to 0.1 µm to 15 µm to facilitate attachment of the metal film for heat dissipation, while damage of the semiconductor component 104 is suppressed. However, even with such surface roughness, since the lower surface 30a of the first component 3a is exposed from the first sealing resin layer 5, a crack may be generated in the lower surface 30a of the first component 3a. If a crack is generated, the crack more easily reaches the circuit surface (upper surface 30b) of the first component 3a, and the first component 3a may be damaged. The table of FIG. 3A illustrates the relationship between the surface roughness Ra of the lower surface 30a of the first component 3a and the presence or absence of a crack in the first embodiment. The number of samples is 500 pcs. As illustrated in the table of FIG. 3A, no crack was generated with the surface roughness of not greater than 0.1 µm.

Further, if metal polishing waste remains on the lower surface 30a of the first component 3a, the polishing waste material may diffuse in the first component 3a and reach the circuit surface, which may cause malfunction of the first component 3a. In particular, in a case where the polishing waste is Cu and the semiconductor of the first component 3a is Si, since Cu easily diffuses in Si, the influence is great. From the above, it is preferable that the surface roughness of the lower surface 30a of the first component 3a is not less than 0.005 µm and not greater than 0.1 µm in consideration of manufacturing cost and the like. By adjusting the surface roughness as described above, it is possible to reduce the number of recesses that become crack start points and prevent metal polishing waste from remaining.

For reference, the table of FIG. 3B illustrates the relationship between the thickness of the first component 3a and the presence or absence of a crack with the surface roughness which does not generate a crack. Here, the "thickness of the first component 3a" refers to the size from the lower surface 30a of the first component 3a to the circuit surface (upper surface 30b) of the first component 3a. As can be seen from the above, if the surface roughness was equal to or less than the desired value, no crack was generated in a case where the thickness of the component was 100 µm. Note that the number of samples is 500 pcs.

Method of Manufacturing Radio-Frequency Module

Next, a method of manufacturing the radio-frequency module 1a will be described with reference to FIGS. 4A to 4D and 5A to 5C. In the first embodiment, the radio-frequency module 1a is manufactured by forming an assembly of a plurality of the radio-frequency modules 1a and then dividing the assembly into individual pieces. Note that the order of processes may be changed or a new process may be added as necessary.

Figure 4A:
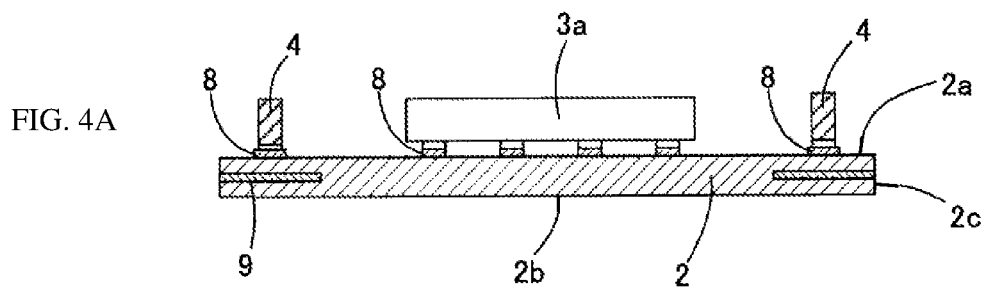
FIGS. 4A to 4D illustrate manufacturing processes of the radio-frequency module illustrated in FIG. 1.
Figure 4B:
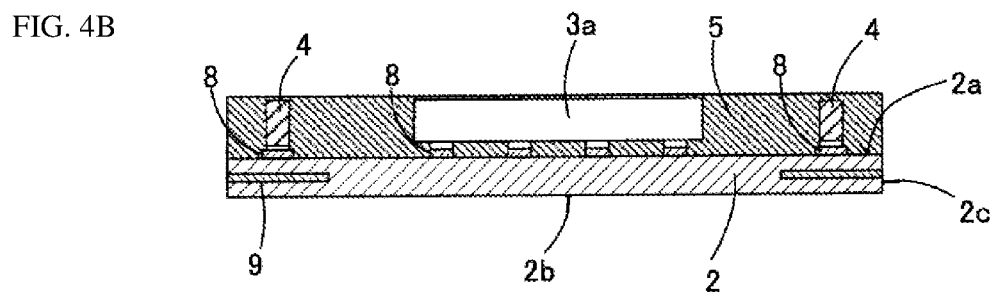

First, as illustrated in FIG. 4A, the first component 3a is mounted on the lower surface 2a of the wiring board 2 by using a well-known surface mounting technique, and then the connection terminals 4 are formed. Each of the connection terminals 4 may be obtained by mounting a metal pin on the mounting electrode 8 to be joined with solder, or each of the connection terminals 4 may be formed in advance on the mounting electrode 8 by plating in advance. Each of the connection terminals 4 may also be a bump. Thereafter, as illustrated in FIG. 4B, the first sealing resin layer 5 is formed so as to cover the first component 3a and the connection terminals 4. The first sealing resin layer 5 can be formed by using a known technique such as a transfer molding method, a compression molding method, or a resin dispensing method. Note that a general epoxy resin containing silica filler can be used for the first sealing resin layer 5.

Further, in order to give the first sealing resin layer 5 high heat conductivity, it is possible to use an epoxy resin containing a filler having a high heat conductivity such as an alumina filler.

Figure 4C:
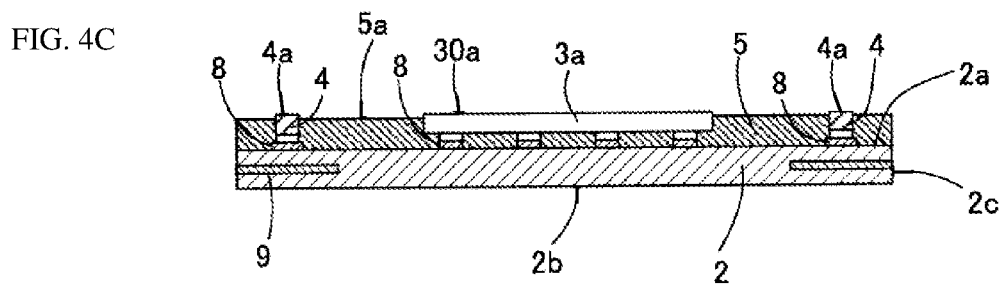

After the first sealing resin layer 5 is formed, as illustrated in FIG. 4C, the lower surface 30a of the first component 3a and the lower surfaces 4a of the connection terminals 4 are exposed by polishing or the like. At this time, polishing conditions are adjusted so that the magnitude relationship of the surface roughness satisfies (lower surface 5a of the first sealing resin layer 5)≤(lower surface 30a of the first component 3a)<(lower surface 4a of the connection terminal 4), and furthermore, the surface roughness of the lower surface 30a of the first component 3a is not less than 0.005 μm and not greater than 0.1 μm. After polishing, a metal film is formed on the lower surface 4a of the connection terminal 4 by plating or the like. Surface treatment such as etching may be performed before plating treatment.

Figure 4D:
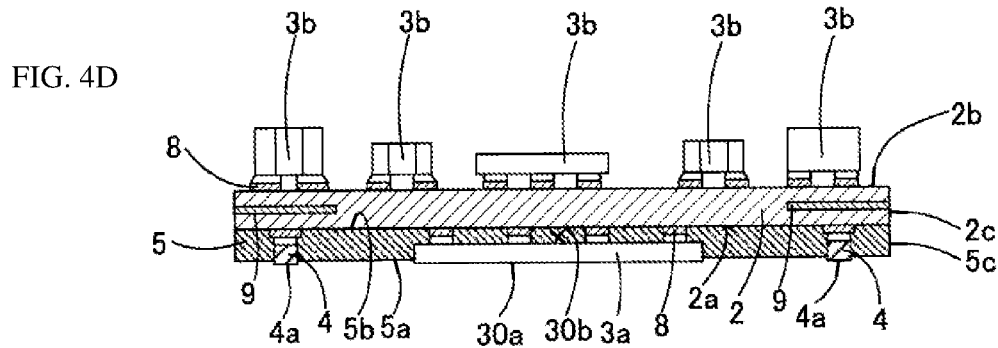
Figure 5A:
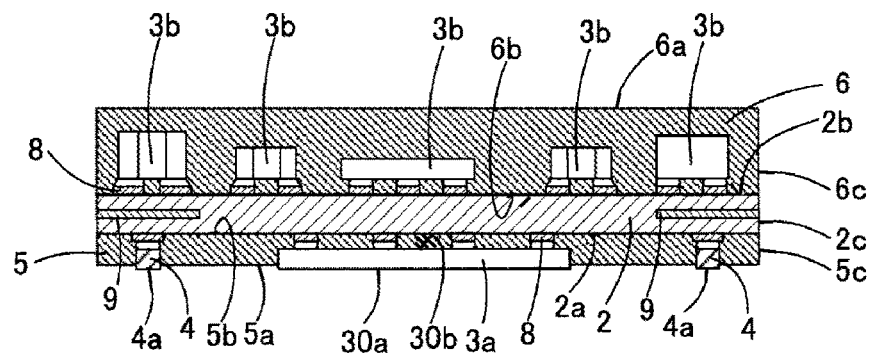
FIGS. 5A to 5C illustrate manufacturing processes of the radio-frequency module illustrated in FIG. 1.

Thereafter, as illustrated in FIG. 4D, the second components 3b are mounted on the upper surface 2b of the wiring board 2 by using a known mounting technique. Next, as illustrated in FIG. 5A, the second sealing resin layer 6 is formed so as to cover the second components 3b. As with the first sealing resin layer 5, the second sealing resin layer 6 can be formed by using a known technique such as the transfer molding method, the compression molding method, or the resin dispensing method. Note that a general epoxy resin containing silica filler can be used for the second sealing resin layer 6. Further, in order to give the first sealing resin layer 5 high heat conductivity, it is possible to use an epoxy resin containing a filler having a high heat conductivity such as an alumina filler.

Figure 5B:
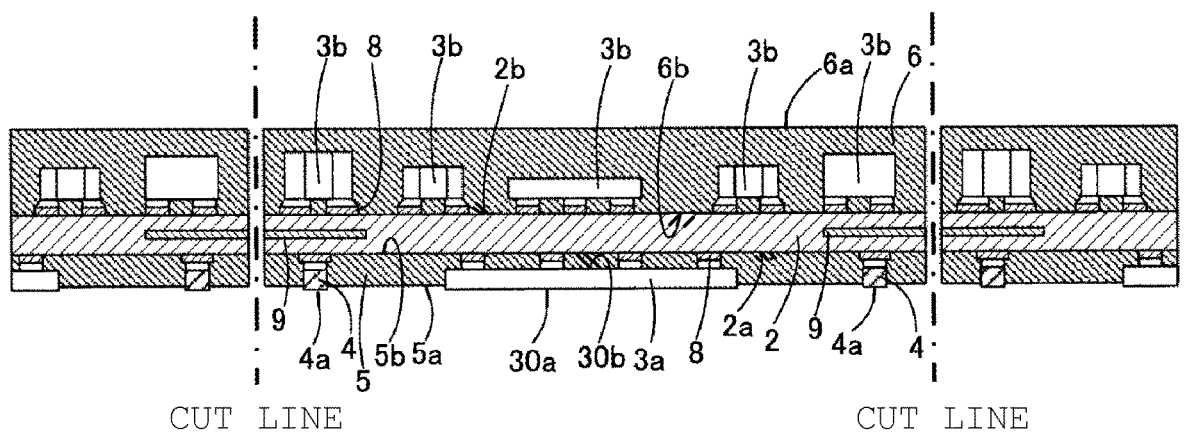

Next, as illustrated in FIG. 5B, the radio-frequency module 1a manufactured as a collective board is cut into pieces by using a dicing machine, laser processing, or the like.

Figure 5C:
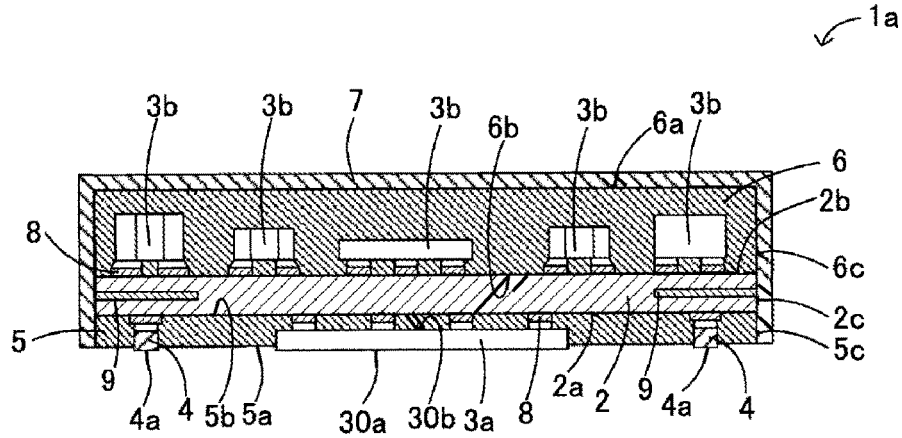

Further, as illustrated in FIG. 5C, the shield film 7 is formed on the side surfaces 2c of the wiring board 2, the side surfaces 5c of the first sealing resin layer 5, the side surfaces 6c and the upper surface 6a of the second sealing resin layer 6. The shield film 7 can be formed by a known method such as sputtering, vacuum deposition, plating, or coating with a conductive resin. Further, before the shield film 7 is formed, a process of removing residual components by a dry process such as plasma cleaning, dry etching, or ion milling may be added.

Therefore, according to the above-described embodiment, by making the surface roughness of the lower surface 5a of the first sealing resin layer 5 smaller than the surface roughness of the lower surface 4a of the connection terminal 4, it is possible to prevent the polishing waste and the plating catalyst from remaining on the lower surface 5a of the first sealing resin layer 5 and to suppress the occurrence of abnormal deposition of plating. Further, by setting the surface roughness of the lower surface 30a of the first component 3a to be equal to or greater than the surface roughness of the lower surface 5a of the first sealing resin layer 5 and to be smaller than the surface roughness of the lower surface 4a of the connection terminal (not less than 0.005 μm and not greater than 0.1 μm), it is possible to prevent a crack from being generated in the lower surface 30a of the first component 3a, and to suppress occurrence of malfunction. Further, by setting the thickness of the first component 3a to be not greater than 100 μm, it is possible to realize the height reduction of the radio-frequency module 1a.

Second Embodiment

A radio-frequency module 1b according to a second embodiment of the present disclosure will be described with reference to FIGS. 6 and 7. Note that FIG. 6 is a sectional view of the radio-frequency module 1b, and FIG. 7 is a plan view illustrating a lower surface 5a of a first sealing resin layer 5 of the radio-frequency module 1b.

Figure 6:
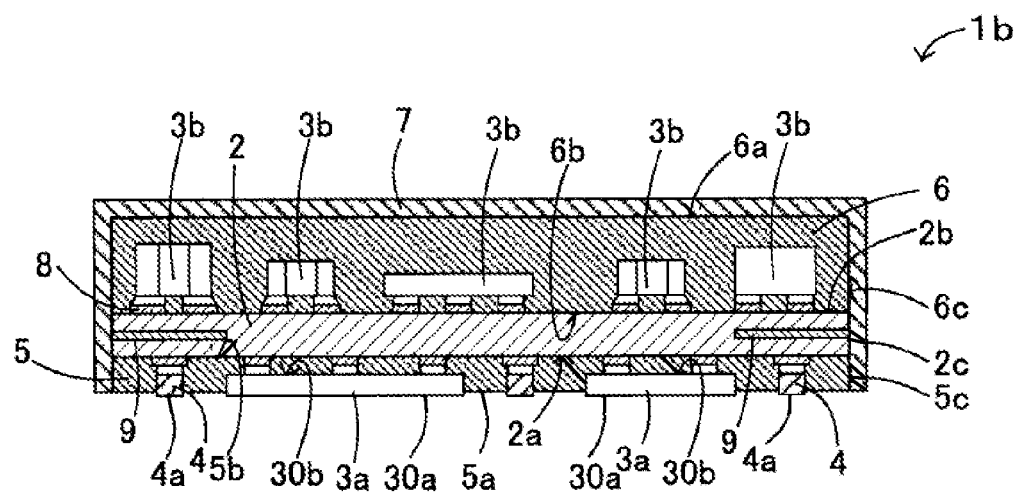
FIG. 6 is a sectional view of a radio-frequency module according to a second embodiment of the present disclosure.
Figure 7:
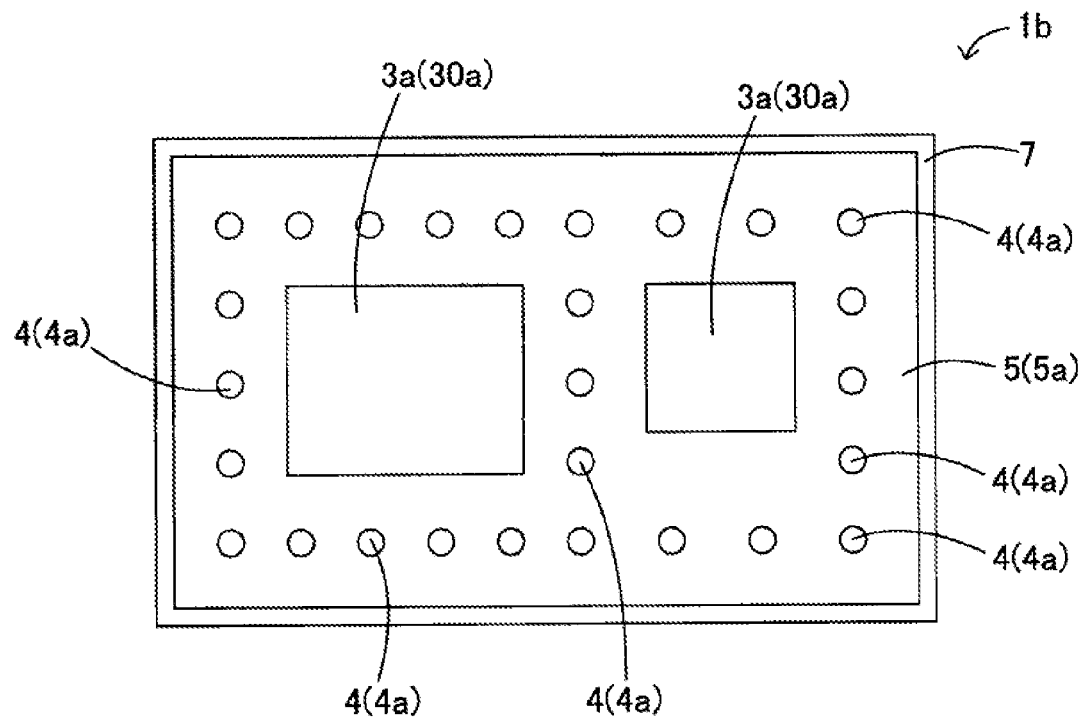
FIG. 7 is a plan view of the radio-frequency module illustrated in FIG. 6.

The radio-frequency module 1b according to this embodiment differs from the radio-frequency module 1a of the first embodiment described with reference to FIGS. 1 and 2 in that, as illustrated in FIGS. 6 and 7, a plurality of first components 3a are mounted on a lower surface 2a of a wiring board 2 and connection terminals 4 are arranged between the adjacent first components 3a.

The configuration other than the above is identical to that of the radio-frequency module 1a of the first embodiment, and therefore, the description thereof will be omitted by giving identical symbols.

In this embodiment, the two first components 3a are mounted on the lower surface 2a of the wiring board 2. Further, the connection terminals 4 are arranged not only in the portion along the outer periphery of the radio-frequency module 1b but also in the portion between the two first components 3a. Note that the number of first components 3a mounted on the lower surface 2a of the wiring board 2 may be three or more, and the connection terminals 4 may be arranged in a plurality of rows.

According to this configuration, in addition to the effects similar to that of the radio-frequency module 1a of the first embodiment, since it is possible to mount more first components 3a on the radio-frequency module 1b, the functionality of the radio-frequency module 1b can be enhanced.

Third Embodiment

Figure 8A:
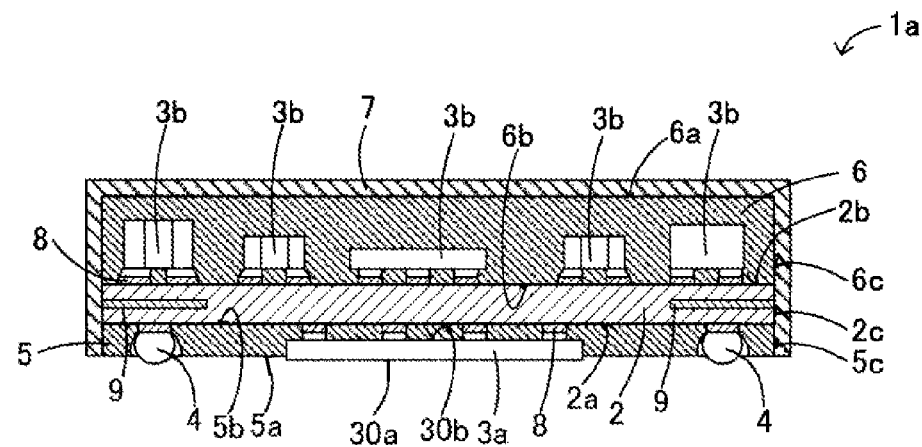
FIGS. 8A and 8B are a sectional view and a plan view of a radio-frequency module according to a third embodiment of the present disclosure.
Figure 8B:
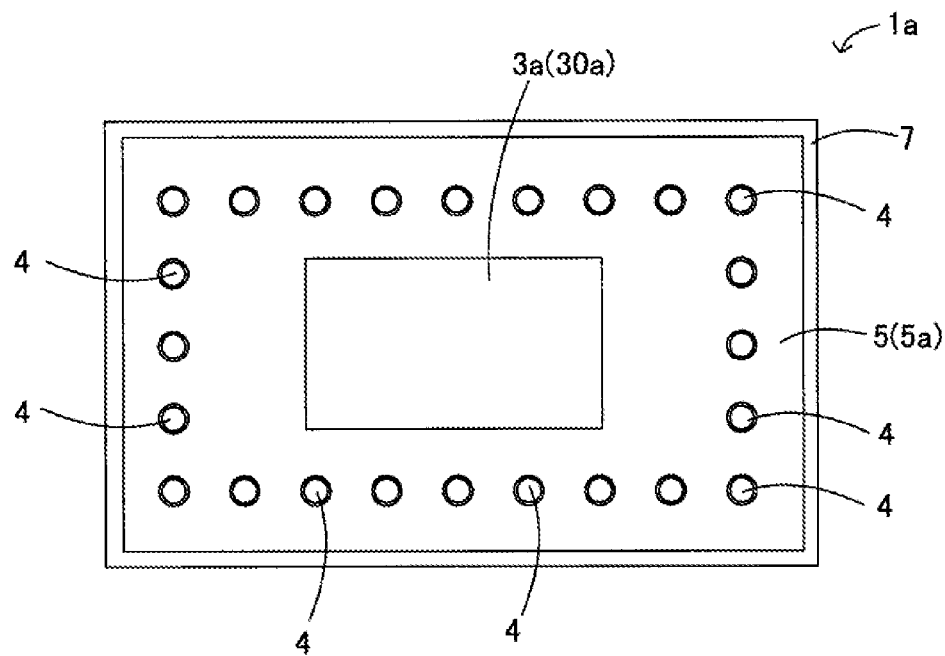
Figure 9:
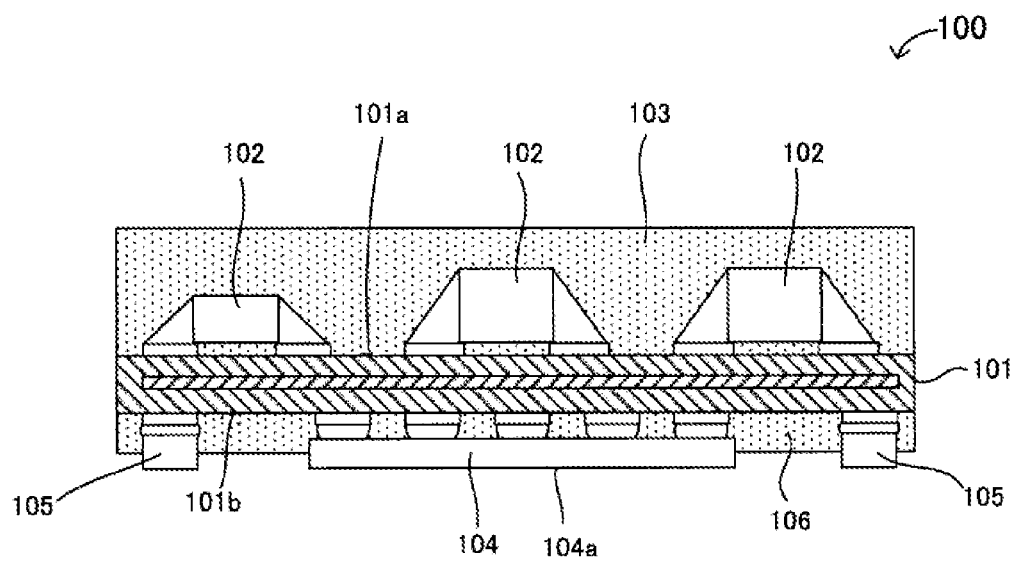
FIG. 9 is a sectional view of a conventional radio-frequency module.

FIGS. 8A and 8B are a sectional view and a plan view of a radio-frequency module according to a third embodiment of the present disclosure, respectively. The third embodiment differs from the first embodiment described with reference to FIGS. 1 and 2 in that connection terminals 4 are formed of bumps such as solder bumps or Au bumps, and can provide similar effects as in the first embodiment.

Note that the present disclosure is not limited to the above-described embodiments, and various modifications other than those described above can be made without departing from the spirit of the disclosure. For example, the configurations of the above-described embodiments and modifications may be combined.

For example, a second component 3b and another component may be mounted on a lower surface 2a of a wiring board 2. At this time, it is desirable that the height of the second component 3b or the other component mounted on the lower surface 2a of the wiring board 2 is preferably lower than the height of a first sealing resin layer 5 after polishing.

Further, a shield film 7 may not be formed. In this case, a ground electrode 9 may not be exposed to a side surface 2c of a wiring board 2.

The present disclosure can be applied to various radio-frequency modules including semiconductor components.

1a, 1b: Radio-frequency module
2: Wiring board
3a: First component
3b: Second component
5: First sealing resin layer
6: Second sealing resin layer

The invention claimed is:

1. A radio-frequency module comprising:
a wiring board;
at least one first component mounted on one main surface of the wiring board;
a first sealing resin layer having a contact surface, a facing surface and side surfaces, the contact surface being in contact with the one main surface of the wiring board, the facing surface facing the contact surface, each of the side surfaces connecting an edge of the contact surface and an edge of the facing surface to each other, and the first sealing resin layer sealing the first component; and
at least one connection terminal embedded in the first sealing resin layer,
wherein an opposite surface on a side opposite to a mounting surface of the first component is exposed from the facing surface of the first sealing resin layer,
one end of the connection terminal is connected to the one main surface of the wiring board, and another end of the connection terminal is exposed from the facing surface of the first sealing resin layer, and
a surface roughness of the opposite surface of the first component is smaller than a surface roughness of the other end of the connection terminal, and a surface roughness of the facing surface of the first sealing resin layer is smaller than a surface roughness of the opposite surface of the first component.

2. The radio-frequency module according to claim 1, wherein a thickness of the first component in a direction perpendicular to the one main surface of the wiring board is not less than 5 µm and not greater than 100 µm, and
the surface roughness of the opposite surface of the first component is not less than 0.005 µm and not greater than 0.1 µm.

3. The radio-frequency module according to claim 1, wherein
the at least one first component includes a plurality of first components, and the at least one connection terminal includes a plurality of connection terminals,
the plurality of first components and the plurality of connection terminals are mounted on the one main surface of the wiring board, and
at least one of the plurality of connection terminals is arranged between adjacent first components among the plurality of first components.

4. The radio-frequency module according to claim 1, further comprising:
a second component mounted on another main surface of the wiring board; and
a second sealing resin layer having a contact surface, a facing surface and side surfaces, the contact surface being in contact with the other main surface of the wiring board, the facing surface facing the contact surface, each of the side surfaces connecting an edge of the contact surface and an edge of the facing surface to each other, and the second sealing resin layer sealing the second component.

5. The radio-frequency module according to claim 4, further comprising a shield film covering at least the side surfaces of the first sealing resin layer, and the side surfaces and the facing surface of the second sealing resin layer.

6. The radio-frequency module according to claim 1, wherein the connection terminal is a bump.

7. The radio-frequency module according to claim 2, wherein
the at least one first component includes a plurality of first components, and the at least one connection terminal includes a plurality of connection terminals,
the plurality of first components and the plurality of connection terminals are mounted on the one main surface of the wiring board, and
at least one of the plurality of connection terminals is arranged between adjacent first components among the plurality of first components.

8. The radio-frequency module according to claim 2, further comprising:
a second component mounted on another main surface of the wiring board; and
a second sealing resin layer having a contact surface, a facing surface and side surfaces, the contact surface being in contact with the other main surface of the wiring board, the facing surface facing the contact surface, each of the side surfaces connecting an edge of the contact surface and an edge of the facing surface to each other, and the second sealing resin layer sealing the second component.

9. The radio-frequency module according to claim 3, further comprising:
a second component mounted on another main surface of the wiring board; and
a second sealing resin layer having a contact surface, a facing surface and side surfaces, the contact surface being in contact with the other main surface of the wiring board, the facing surface facing the contact surface, each of the side surfaces connecting an edge of the contact surface and an edge of the facing surface to each other, and the second sealing resin layer sealing the second component.

10. The radio-frequency module according to claim 2, wherein the connection terminal is a bump.

11. The radio-frequency module according to claim 3, wherein the connection terminal is a bump.

12. The radio-frequency module according to claim 4, wherein the connection terminal is a bump.

13. The radio-frequency module according to claim 5, wherein the connection terminal is a bump.

* * * * *